United States Patent
Kim

(12) 
(10) Patent No.: US 6,403,978 B1
(45) Date of Patent: Jun. 11, 2002

(54) TEST PATTERN FOR MEASURING VARIATIONS OF CRITICAL DIMENSIONS OF WIRING PATTERNS FORMED IN THE FABRICATION OF SEMICONDUCTOR DEVICES

(75) Inventor: Jong-Cheol Kim, Kyungki-do (KR)

(73) Assignee: Citicorp USA, Inc., New York, NY (US)

( * ) Notice: Subject to any disclaimer, the term of this patent is extended or adjusted under 35 U.S.C. 154(b) by 0 days.

(21) Appl. No.: 09/261,280

(22) Filed: Mar. 2, 1999

(30) Foreign Application Priority Data

Mar. 2, 1998 (KR) .............................. 98-6730

(51) Int. Cl.⁷ .............................................. H01L 23/58
(52) U.S. Cl. .............................. 257/48; 257/49; 257/50
(58) Field of Search ....................... 257/48–50; 438/11, 438/14, 15, 18

(56) References Cited

U.S. PATENT DOCUMENTS 5,179,433 A * 1/1993 Misawa ...................... 257/48
5,780,870 A * 7/1998 Maeda ....................... 257/48
6,028,324 A * 2/2000 Su ............................. 257/48
6,143,579 A * 11/2000 Chang ........................ 438/17

FOREIGN PATENT DOCUMENTS

EP          0562309 A2 *  9/1993

* cited by examiner

*Primary Examiner*—Olik Chaudhuri
*Assistant Examiner*—Nathan W. Ha

(57) ABSTRACT

A test pattern comprising a first region as an active region of a semiconductor device and a second region as a device isolation region around the first region. Formed on the second region of the substrate is a stepped layer having a different height from the first region. A plurality of parallel critical dimension bars are provided across the first and second regions. The stepped layer is an oxide layer formed at the same time when a device isolation oxide layer is formed on the chip region such that the test pattern according to the present invention has a similar configuration with the actual pattern on the chip region.

20 Claims, 2 Drawing Sheets

TEST PATTERN FOR MEASURING VARIATIONS OF CRITICAL DIMENSIONS OF WIRING PATTERNS FORMED IN THE FABRICATION OF SEMICONDUCTOR DEVICES

BACKGROUND OF THE INVENTION (a) Field of the Invention

The present invention relates to an improved test pattern that is monitored to measure critical dimensions of patterns formed during the fabrication of semiconductor devices.

(b) Description of the Related Art

Photolithographic technology is generally used to form patterns on semiconductor devices. A master photomask is made using an electron beam exposure system; then its image is reciprocated on a wafer by optical printers. Exposing radiation is transmitted through a clear part of a mask. An opaque part of the circuit pattern blocks some of the radiation. A resist, which is sensitive to the radiation and has resistance to the etching, is coated on the wafer surface. The mask is aligned within a required tolerance on the wafer; then radiation is applied through the mask, the resist image is developed, and a layer underneath the resist is etched.

The wafer comprises a plurality of chip regions each having a predetermined circuit design in matrix formation and a plurality of scribing regions defining the chip regions. Each chip region comprises several active regions and device isolation regions, with a plurality of devices being formed on the active regions. Each scribing region has alignment marks for aligning critical dimension bars of a pattern on the chip.

The critical dimension bars of the chip pattern can undergo alteration as a result of exposure and etch process conditions, and by proximity effect caused by an arrangement of the critical dimension bars. To be able to detect these alterations, a test pattern is formed identical to that of the chip pattern, and is formed using the same etch and photolithographic method. Accordingly, the variations in the critical dimension bars of the chip pattern can be measured indirectly by detecting the change in the test pattern on the scribing region.

As shown in FIG. 1, the prior art test pattern comprises a plurality of critical dimension bars 3 and 3' respectively arranged in horizontal and vertical directions on a silicon wafer. The critical dimension bars 3 and 3' are formed having different lengths, densities and widths, because the effects given by light or gas during exposure and etch processes are variable according to the formation of a test pattern mask.

However, since the critical dimension bars 3 and 3' of this test pattern are arranged only on a plane surface of a substrate, the measurement of variations in the critical dimension bars of the chip pattern on other non-planar areas such as a step portion is difficult. That is, the critical dimension bars of the chip pattern are formed not only on active regions but also extended over a device isolation region or inter-layer isolation region formed having a step portion with an active region. Accordingly, it is impossible to measure the variations of the chip pattern on the surface of stepped portions using this test pattern.

SUMMARY OF THE INVENTION

In accordance with the present invention, an improved test pattern is formed in the same manner as the patterns on the chip region so as to precisely monitor the variations of patterns on the chip region.

To achieve this result, the test pattern comprises a first region as an active region of a semiconductor device and a second region as a device isolation region around the first region. The second region, which is formed on a substrate, includes a stepped layer that is different in height from the first region. A plurality of parallel critical dimension bars are provided across the first and second regions.

The stepped layer may be an oxide layer formed at the same time when a device isolation oxide layer is formed on the chip region.

Accordingly, the critical dimension bars of the test pattern according to the present invention have a similar configuration with the critical dimension bars of the pattern on the chip region.

DETAILED DESCRIPTION

This application is substantially similar to Korean Patent Application No. 98-6730 filed on Mar. 2, 1998, the disclosure of which is incorporated herein by reference in its entirety.

A test pattern for semiconductor devices according to an embodiment of the present invention will be hereinafter described with reference to the accompanying drawings.

Figure 1:
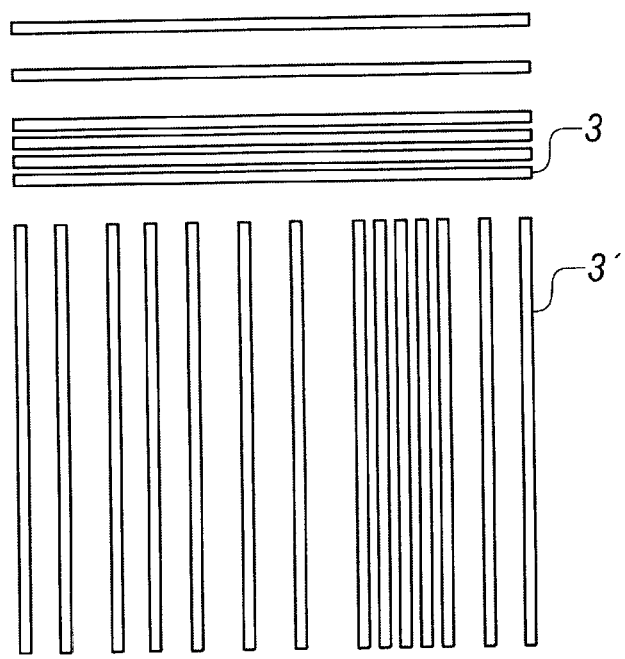
FIG. 1 is a plane view of a conventional test pattern for a semiconductor device.
Figure 2:
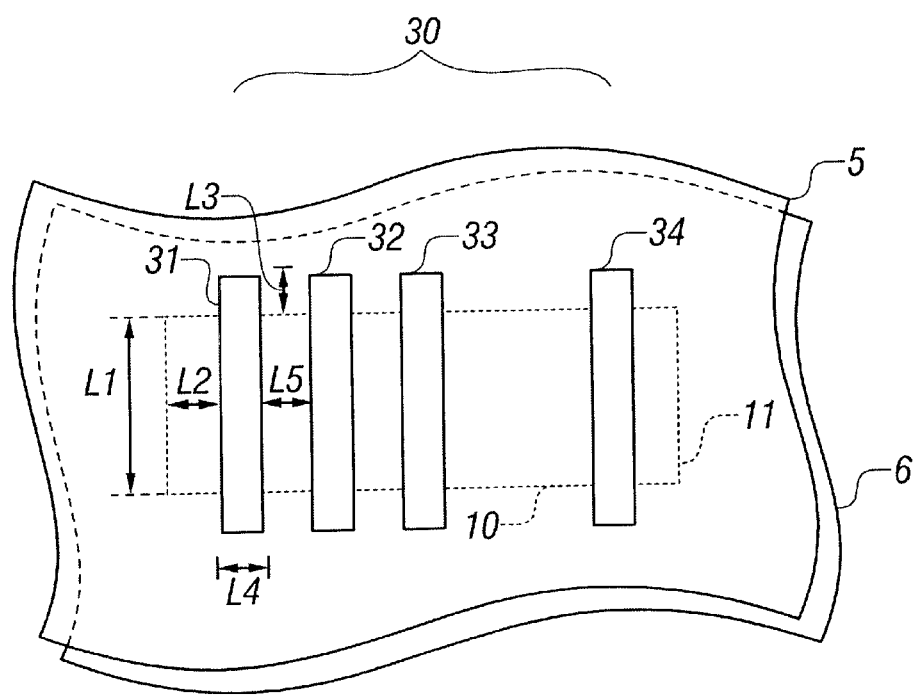
FIG. 2 is a plane view of a structure in which a mask for critical dimension bars and a mask for device isolation are aligned for forming a test pattern according to an embodiment of the present invention.

Referring to FIG. 2, a rectangular first region 10 for defining an active region of a semiconductor device is formed on a first mask 5 for forming the test pattern. A second region 20 for defining a device isolation region is formed around the first region 10 on the first mask 5. Also, a plurality of regions 30 for defining a plurality of critical dimension bars are formed across the first region 10 on a second mask 6. The regions 30 (and, under ideal condition, the critical dimension bars 310, 320, 330 and 340 respectively corresponding to critical dimension bars 31, 32, 33 and 34 as discussed below) can be formed having various widths L4 and various intervals L5, while maintaining a predetermined pitch defined by the width L4 plus an interval L5; or can be arranged with various intervals L5 and various pitches while maintaining the width L4 at a predetermined length. Also a length L3 to which the regions 30 extend from first region 10 into the second region 20, can be formed to identical or different dimensions on opposite ends.

According to the present invention, it is preferable that a vertical length L1 of the first region 10 is greater than 1 μm, and an interval L2 between the vertical portion of boundary line 11 of the first region 10 and an adjacent critical dimension bar 31 is greater than 0.5 μm. This is due to the fact that a diffused reflection of light on a step portion between the first region 10 and the second region 20 can cause a photoresist layer around the step portion to be severely damaged during exposure. That is, the amount of light irradiating around the step portion is increased due to the diffused reflection of light thereon. As a result, it is possible for the light to be distorted.

Also the length L3 of the critical dimension bar 31 extending from the first region 10 into the second region 20 is formed to be less than 0.5 μm so that the variation of the critical dimension bar 31 on the step portion can be measured.

A test pattern according to an embodiment of the present invention on a scribing region of a wafer will be described with reference to the accompanying drawings.

Figure 3:
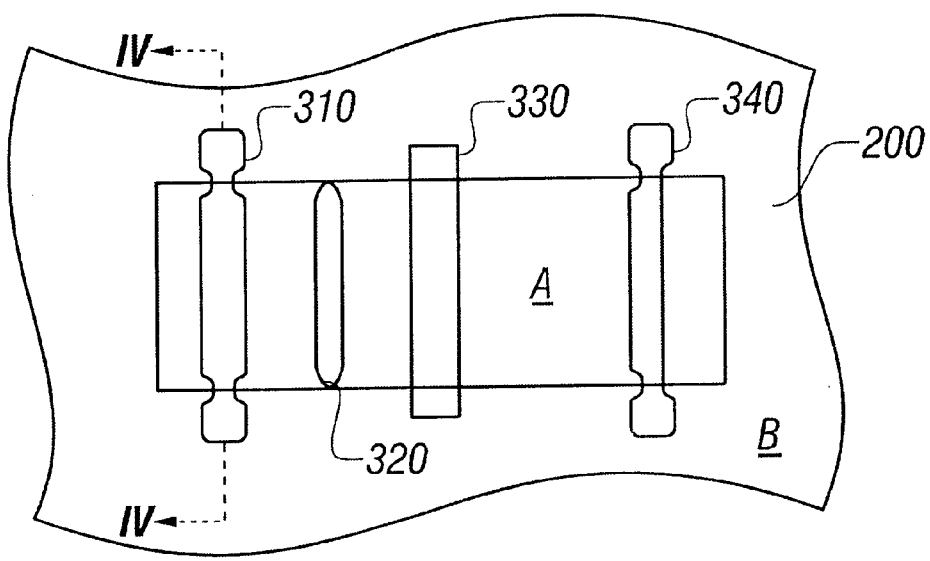
FIG. 3 is a plane view of the test pattern according to an embodiment of the present invention.
Figure 4:
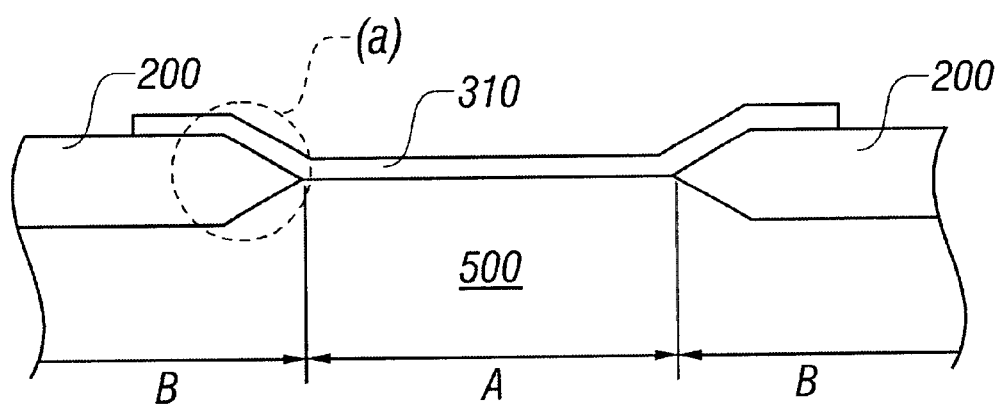
FIG. 4 is a cross-sectional view taken along line IV—IV of FIG. 3.

FIG. 3 is a plane view of a test pattern having various critical dimension bars formed by a photolithography or etch process using the structure of FIG. 2, and FIG. 4 is a cross-sectional view taken along line IV—IV of FIG. 3.

As shown in FIGS. 3 and 4, the test pattern according to the present invention comprises a substrate 500 divided into a rectangular active region A and a device isolation region B surrounding the active region A, and a device isolation oxide layer 200 formed on the device isolation region B. The device isolation oxide layer 200 is formed at the same time when a device isolation layer is formed on a chip region of the substrate. That is, either a LOCOS (local oxidation of silicon) or a STI (shallow trench isolation) process is utilized so that device isolation oxide layer 200 is a stepped layer having a different height from active region A. Also, four critical dimension bars 310, 320, 330, and 340, made of metal or polysilicon, are formed in the vertical direction over the surface of the substrate 500 corresponding to the regions 30 for forming critical dimension bars of the second mask 6 in FIG. 2.

As shown in FIG. 4, the test pattern includes the critical dimension bar 310 on a stepped portion (a) of the device isolation region B and the active region A. In one embodiment, each end of the critical dimension bar 310 overlaps on (extends over) device isolation region B and device isolation oxide layer 200 by less than 0.5 μm. As this is similar to the pattern on the chip region, it is possible to measure the variations of the critical dimension bars of chip pattern by detecting the variations in the critical dimension bars 310, 320, 330 and 340 of the test pattern provided in the scribing region.

The critical dimension bars of the test pattern can be formed in various shapes by using the masks of FIG. 2. FIG. 3 shows one example of how the critical dimension bars can be formed.

Now, the various critical dimension bars formed by using the masks of FIG. 2 will be described with reference to FIG. 3.

In the photolithography process, although the first region 10 and the regions 30 (the critical dimension bars 31, 32, 33, and 34) of the masks 5 and 6 in FIG. 2 have right-angle corners, the test pattern produced by an exposure process has rounded corners. That is, the first region A and the critical dimension bars 310, 320, 330, and 340 in FIG. 3 are rounded since, in the case of using a positive photoresist, the amount of the irradiating light increases at the corner portions to damage the photoresist layer more than other areas.

The critical dimension bar 330 in FIG. 3 shows a case where a length of the same is shortened by excessive irradiation at the corner portions. Since this can cause a serious problems in the semiconductor device, the length L3 in FIG. 2 must be precisely determined.

A photoresist or metal line on a stepped portion caused by a device isolation oxide layer such as a portion (a) in FIG. 4 can be more damaged than other regions by diffused reflection of light or gas during an exposure or etch process. The critical dimension bars 310 and 340 in FIG. 3 show a case where widths of the same are decreased at portions corresponding to the boundary portion of the active region A and device isolation oxide layer 200 as a result of the above mentioned diffused reflection.

The critical dimension bar 320 in FIG. 3 shows a case where a length of the same is excessively shortened due to both the large amount of the light irradiation and the diffused reflection. As a result, the critical dimension bar 320 is formed only on the active region A. Also, the width of the critical dimension bar 320 is decreased by proximity effect. Proximity effect is damage caused by irradiating light diffusion caused when the light irradiates through adjacent critical dimension bars in the photoresist pattern, as in the case where the photoresist patterns are densely formed.

Finally, the critical dimension bar 340 in FIG. 3 shows a case where a longitudinal side of the same close to the device isolation oxide layer 200 is excessively removed by the diffused reflection of light on the adjacent stepped portion.

As described above, since the width and length of critical dimension bars can be decreased, the vertical length L1 of the first region 10 and hence length of active region A, should be longer than 1 μm. Further, the interval L2 between the vertical portion of the boundary line 11 of the first region 10 and the adjacent critical dimension bar 31, and hence the interval between the vertical portion of the boundary line of device isolation oxide layer 200 and the critical dimension bar 310, should be longer than 0.5 μm to prevent the above such problems in the formation of the critical dimension bars.

Accordingly, the critical dimension bars or electrodes of the test pattern produced according to the present invention must be formed under the same conditions as those of the pattern on the chip region so that the variations of critical dimension bars of the test pattern in the exposure and etch processes can be detected. Furthermore, potential problems in the critical dimension bars on the chip region can be detected by monitoring the test pattern so that it is possible to improve the device characteristics and increase process yield.

What is claimed is:

1. A test pattern of a semiconductor device comprising:
   a substrate divided into first and second regions;
   a stepped layer formed on the second region having a different height from the first region; and
   a plurality of critical dimension bars provided across the first region and the stepped layer in a first direction,
   wherein the stepped layer is a device isolation oxide layer formed concurrently with the formation of a device isolation layer on a chip region of the substrate, one end or both ends of the critical dimension bars are extended to be on the stepped layer, and widths of the critical dimension bars and intervals between the critical dimension bars are varied while a pitch defined by a width plus an interval is fixed.

2. A test pattern of a semiconductor device comprising:
   a substrate divided into first and second regions;
   a stepped layer formed on the second region having a different height from the first region; and
   a plurality of critical dimension bars provided across the first region and the stepped layer in a first direction,
   wherein widths of the critical dimension bars and intervals between the critical dimension bars are varied while a pitch defined by a width plus an interval is fixed.

3. A test pattern of claim 2, wherein the stepped layer is a device isolation oxide layer formed concurrently with the formation of a device isolation layer on a chip region of the substrate.

4. A test pattern of claim 2, wherein one end or both ends of the critical dimension bars are extended to be on the stepped layer.

5. A test pattern of claim 1, wherein a length of the first region is greater than 1 μm.

6. A test pattern of claim 1, wherein an interval between a vertical portion of a boundary line of the stepped layer and a critical dimension bar closest to the vertical portion of the boundary line of the stepped layer is greater than 0.5 μm.

7. A test pattern of claim 1, wherein at least one of the critical dimension bars overlaps on the stepped layer by less than 0.5 μm.

8. A test pattern of claim 7, wherein both ends of the at least one critical dimension bar are formed on the stepped portion, and lengths of critical dimension bar are dissimilar.

9. A test pattern of claim 1, wherein the critical dimension bars are made of polysilicon or metal.

10. A test pattern of claim 4, wherein a length of the first region is greater than 1 μm.

11. A test pattern of claim 4, wherein an interval between a vertical portion of a boundary line of the stepped layer and a critical dimension bar closest to the vertical portion of the boundary line of the stepped layer is greater than 0.5 μm.

12. A test pattern of claim 4, wherein at least one of the critical dimension bars overlaps on the stepped layer by less than 0.5 μm.

13. A test pattern of claim 4, wherein the critical dimension bars are made of polysilicon or metal.

14. A test pattern of a semiconductor device comprising:
a substrate divided into first and second regions;
a stepped layer formed on the second region having a different height from the first region; and
a plurality of critical dimension bars provided across the first region and the stepped layer in a first direction,
wherein each of said plurality of critical dimension bars has a first width and is separated from another one of said plurality of critical dimension bars by a first interval, and said first width and said first interval vary between said plurality of critical dimension bars while a pitch defined by said first width plus said first interval is fixed.

15. A test pattern of claim 14, wherein the stepped layer is a device isolation oxide layer formed concurrently with the formation of a device isolation layer on a chip region of the substrate.

16. A test pattern of claim 14, wherein one end or both ends of the critical dimension bars are extended to be on the stepped layer.

17. A test pattern of claim 16, wherein a length of the first region is greater than 1 μm.

18. A test pattern of claim 16, wherein an interval between a vertical portion of a boundary line of the stepped layer and a critical dimension bar closest to the vertical portion of the boundary line of the stepped layer is greater than 0.5 μm.

19. A test pattern of claim 16, wherein at least one of the critical dimension bars overlaps on the stepped layer by less than 0.5 μm.

20. A test pattern of claim 16, wherein the critical dimension bars are made of polysilicon or metal.

* * * * *

UNITED STATES PATENT AND TRADEMARK OFFICE
CERTIFICATE OF CORRECTION

PATENT NO.    : 6,403,978 B1
DATED         : June 11, 2002
INVENTOR(S)   : Jong-Cheol Kim It is certified that error appears in the above-identified patent and that said Letters Patent is hereby corrected as shown below:

<u>Title page,</u>
Item [73], Assingee, should read as follows:
-- [73]   Assingee:      Anam Semiconductor, Inc., Seoul (KR) and
                         Amkor Technology, Inc., Chandler, Arizona (US) --

Signed and Sealed this

First Day of June, 2004

JON W. DUDAS
*Acting Director of the United States Patent and Trademark Office*